(12) United States Patent
Hsiao

(10) Patent No.: US 8,630,094 B2
(45) Date of Patent: Jan. 14, 2014

(54) SERVER CABINET

(75) Inventor: Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 242 days.

(21) Appl. No.: 13/082,534

(22) Filed: Apr. 8, 2011

(65) Prior Publication Data

US 2012/0155034 A1    Jun. 21, 2012

(30) Foreign Application Priority Data

Dec. 16, 2010   (TW) .............................. 99144293 A

(51) Int. Cl.
*H05K 7/16*   (2006.01)

(52) U.S. Cl.
USPC ........... 361/726; 361/728; 361/727; 361/730; 361/741; 361/802

(58) Field of Classification Search
USPC ........ 361/726, 756, 741, 802, 797; 312/334.1
See application file for complete search history.

(56) References Cited

U.S. PATENT DOCUMENTS

| | | | |
|---|---|---|---|
| 3,328,646 A * | 6/1967 | Caillat | 361/796 |
| 6,269,959 B1 * | 8/2001 | Haworth | 211/26 |
| 2003/0106863 A1 * | 6/2003 | Lauchner et al. | 211/26 |
| 2003/0107308 A1 * | 6/2003 | Kueng et al. | 312/334.1 |
| 2003/0205539 A1 * | 11/2003 | Lauchner et al. | 211/26 |
| 2004/0016709 A1 * | 1/2004 | Felcman et al. | 211/26 |
| 2004/0120123 A1 * | 6/2004 | Mayer | 361/725 |
| 2005/0078461 A1 * | 4/2005 | Dobbs et al. | 361/756 |
| 2010/0187960 A1 * | 7/2010 | Liang | 312/334.1 |

* cited by examiner

Primary Examiner — Tuan T Dinh
Assistant Examiner — Steven T Sawyer
(74) Attorney, Agent, or Firm — Altis Law Group, Inc.

(57) ABSTRACT

A cabinet for server includes a frame, and a plurality of guiding rails. Each guiding rail includes a connection portion and an inclined portion. An acute angle is defined between the inclined portion and the connection portion.

10 Claims, 5 Drawing Sheets

SERVER CABINET

BACKGROUND

1. Technical Field

The disclosure generally relates to cabinets and, particularly, to a server cabinet that occupies a relatively smaller space and is effective in heat dissipation.

2. Description of Related Art

Servers are usually mounted on shelves in a cabinet, which is not conducive to heat dissipation and takes up a lot of space.

Therefore, there is room for improvement within the art.

BRIEF DESCRIPTION OF THE DRAWINGS

Many aspects of the exemplary server cabinet can be better understood with reference to the following drawings. The components in the drawings are not necessarily drawn to scale, the emphasis instead being placed upon clearly illustrating the principles of the server cabinet. Moreover, in the drawings, like reference numerals designate corresponding parts throughout the several views, in which.

DETAILED DESCRIPTION

The disclosure is illustrated by way of example and not by way of limitation in the accompanying drawings. It should be noted that references to "an" or "one" embodiment in this disclosure are not necessarily to the same embodiment, and such references can include the meaning of "at least one" embodiment where the context permits.

Figure 1:
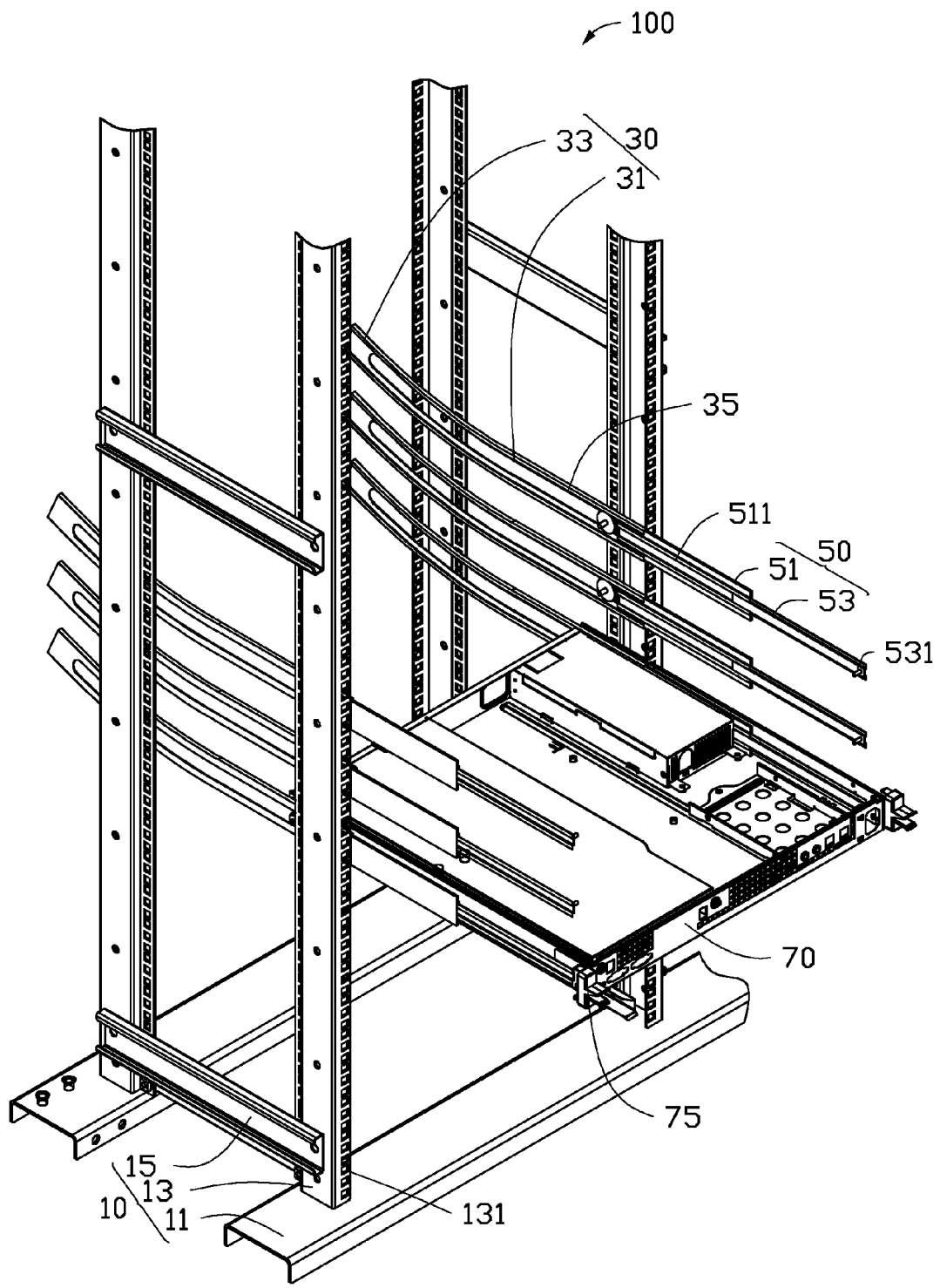
FIG. 1 is an assembled, isometric view of a first exemplary embodiment of a server cabinet.
Figure 2:
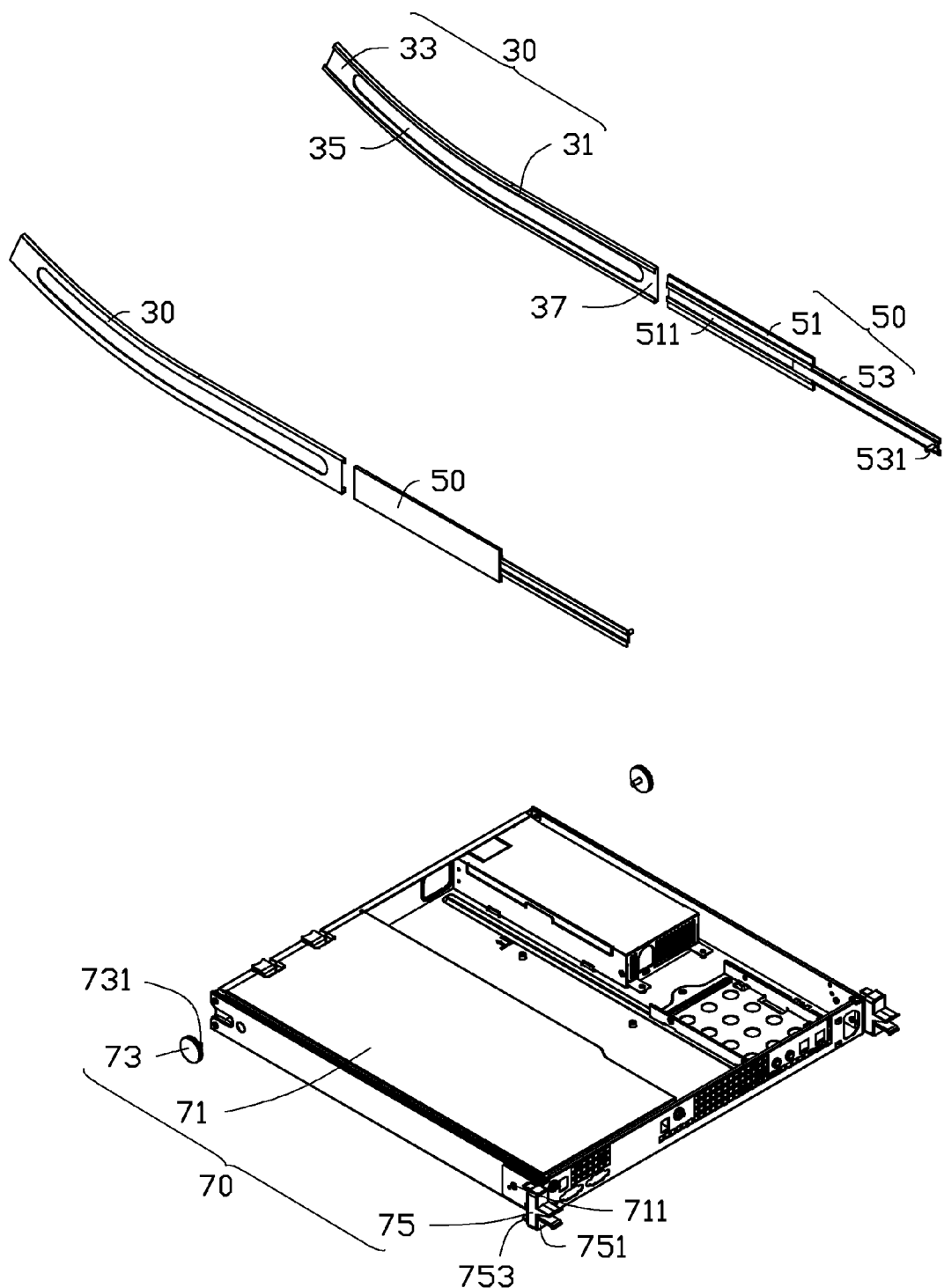
FIG. 2 is an exploded, isometric view of a server, two guiding rails, and two sliding modules of the cabinet of FIG. 1.

FIG. 1 and FIG. 2 illustrate a cabinet 100 to receive a server 70. The cabinet 100 includes a frame 10, a number of guiding rails 30, and a number of sliding modules 50. The guiding rails 30 are secured to opposite sides of frame 10 in pairs. Each sliding module 50 is slidably attached to a corresponding guiding rail 30. The server 70 is attached to the guiding rails 30 and the sliding module 50, and is at an angle relative to the horizontal plane of the cabinet 100.

The frame 10 includes two bottom plates 11, four side pates 13, and a number of reinforcement plates 15. The two bottom plates 11 are parallel to each other. The side plates 13 are substantially parallel to each other and are substantially perpendicularly secured to the bottom plates 11. Opposite ends of each plate 15 are secured to adjacent side plates 13 to improve strength and stability of the frame 10. A number of latching holes 131 are spaced apart defined in each side plate 13.

Referring to FIG. 2, each guiding rail 30 includes a connection portion 31 and an inclined portion 33. An angle in a range of about 5°-85° is defined between the connection portion 31 and the inclined portion 33. The angle may be 5°, 15°, 30°, 45°, 60°, 75°, or 85°. The connection portion 31 and the inclined portion 33 are integrally formed. A guiding slot 35 is defined in each guiding rail 30. A receiving slot 37 is defined between the opposite sides of each guiding rail 30 to slidably receive the sliding module 30.

Each sliding module 50 includes a first sliding element 51 and a second sliding element 53. The second sliding element 53 is slidably attached to the first sliding element 51. Each first sliding element 51 is slidably received in the corresponding receiving slot 37. A receiving groove 511 is defined in the first sliding element 51. A width of the receiving groove 511 is substantially equal to a width of the second sliding element 53 so that the second sliding element 53 can slide in the receiving groove 511. A post 531 projects from one end of the second sliding element 53.

The server 70 includes a housing 71, two wheels 73, and two latching elements 75. The two wheels 73 are attached to opposite sides of the housing 71 at one end, and the two latching elements 75 are attached to opposite sides of the housing 71 at the other end. The wheels 73 are for attaching the server 70 to the guiding rails 30 and allowing the server to roll in and out of the cabinet 100. The latching elements 75 are for locking the server 70 to the frame 10. A receiving hole 711 is defined in opposite sides of the housing 71. Each receiving hole 711 is adjacent to a corresponding latching element 75. A loop groove 731 is defined in each wheel 73 to receive opposite sidewalls of the guiding slot 35. Each latching element 75 includes a base portion 751 and two elastic arms 753, and the two elastic arms 753 project from the base portion 751 in a V-shape.

During assembly, the side plates 13 are secured to the bottom plates 11. Opposite ends of each plate 15 are secured to adjacent side plates 13. The guiding rails 30 are secured to the side plates 13. The inclined portion 33 of each guiding rail 30 is higher than the corresponding connection portion 31. Opposite sidewalls of the guiding slot 35 are received in the loop groove 731 of each wheel 73. Each post 531 is received in corresponding receiving hole 711, and the sliding modules 50 are slidably attached to corresponding guiding rail 30, thus, the cabinet 100 of the first exemplary embodiment is assembled, as shown in FIG. 1.

Figure 3:
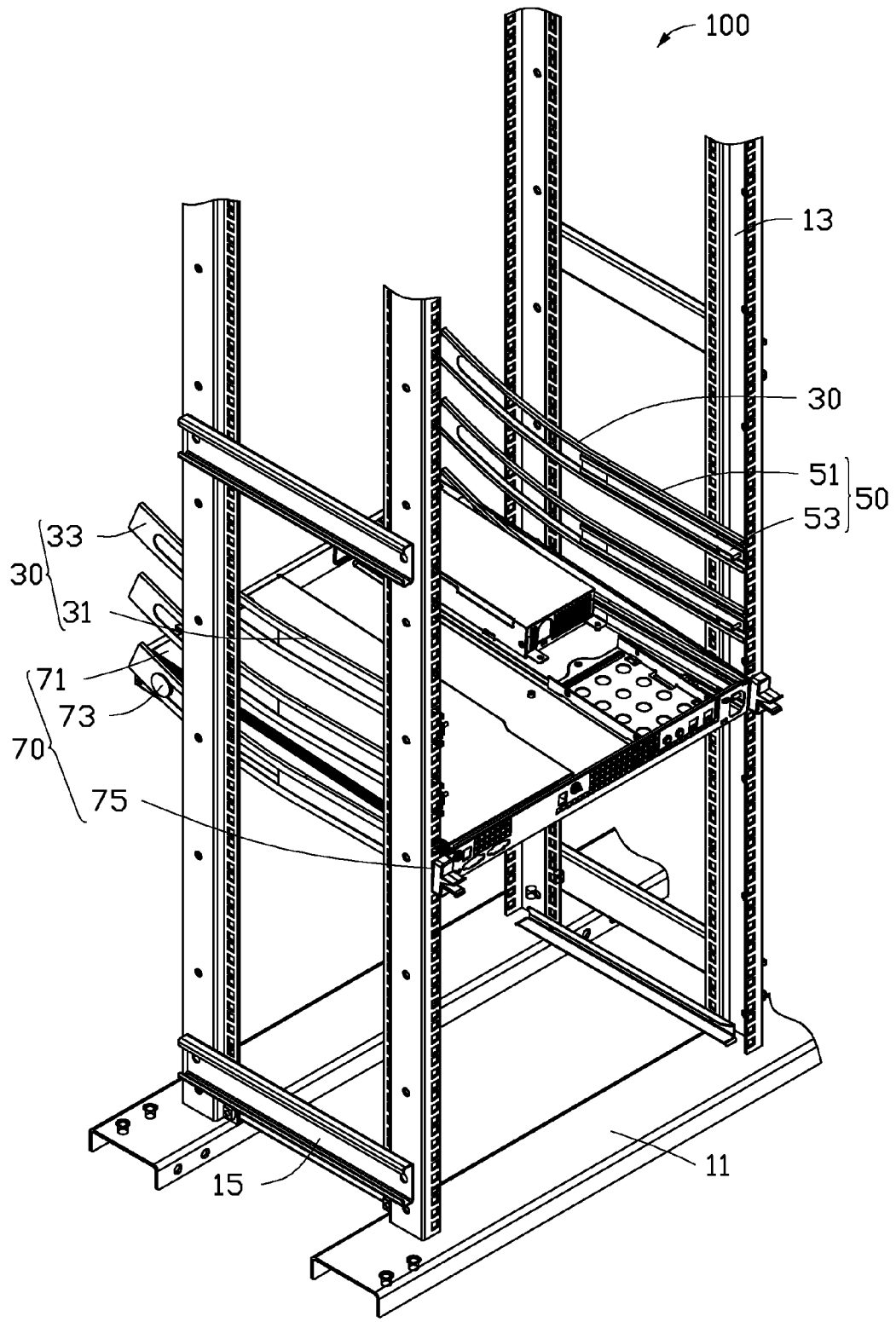
FIG. 3 is similar to FIG. 1, but showing the cabinet in another state.
Figure 4:
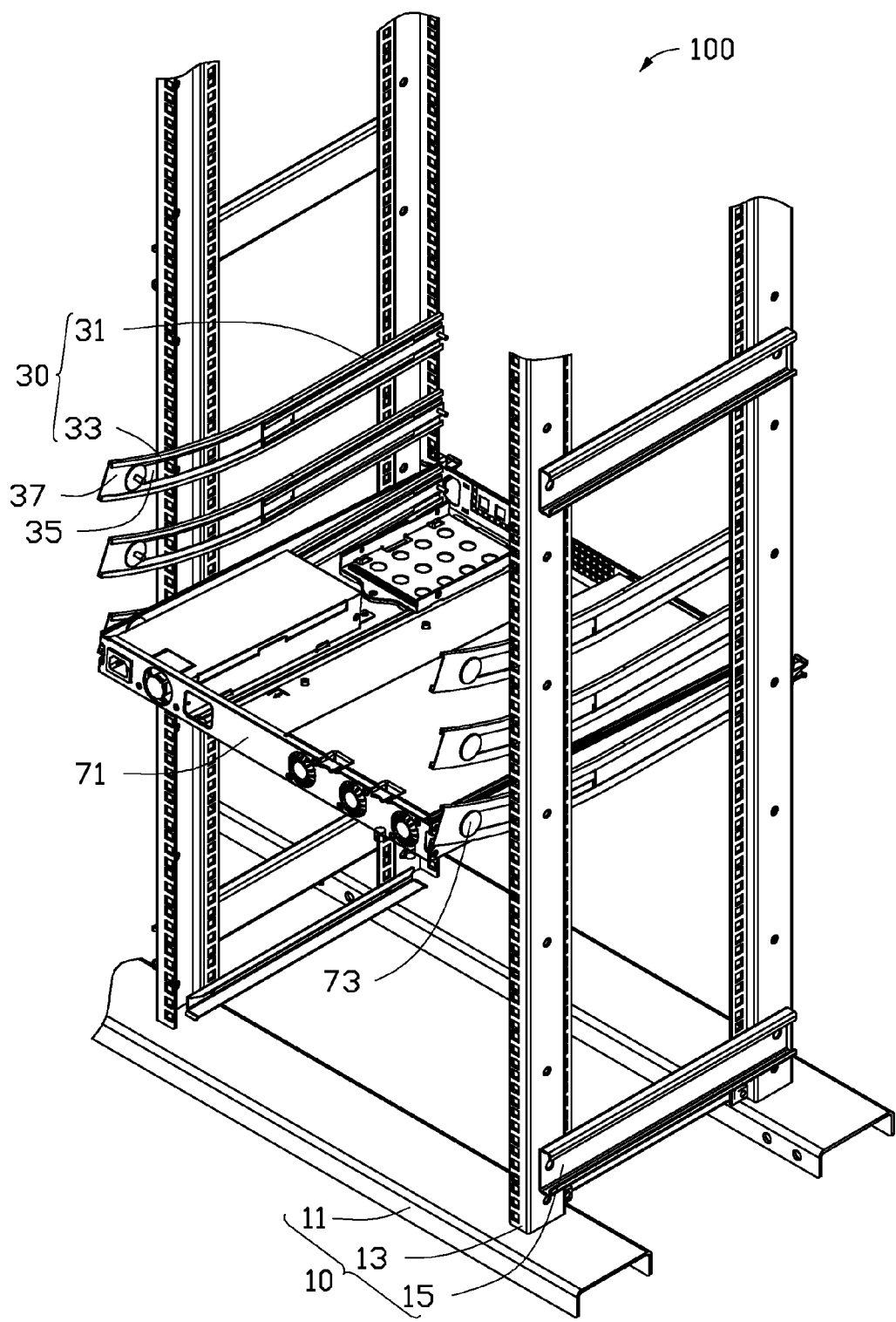
FIG. 4 Similar to FIG. 3, but viewed from another aspect.

Referring to FIGS. 3 and 4, to lock the server 70 to the frame 10, the server 70 is pushed, each wheel 73 rolls in the corresponding guiding slot 35. The server 70 is further pushed, each wheel 73 rolls along the corresponding inclined portion 33 of the guiding rail 30 until the latching element 75 resists the side plate 13. The arms 751 are pressed to be received in the latching holes 131, thus the server 70 is locked to the frame 10.

In the above exemplary embodiment, one end of the server 70 is positioned higher than the other end. When the server 70 is in use, density of air heated by the server 70 adjacent to the other end becomes smaller and moves towards the higher end to form an airflow so that heat generated by the server 70 can be taken away. Additionally, the server 70 being inclined, allow for a distance between the adjacent side plates 13 to be shorter than the length of the server 70, thus the cabinet 100 takes up less room.

Figure 5:
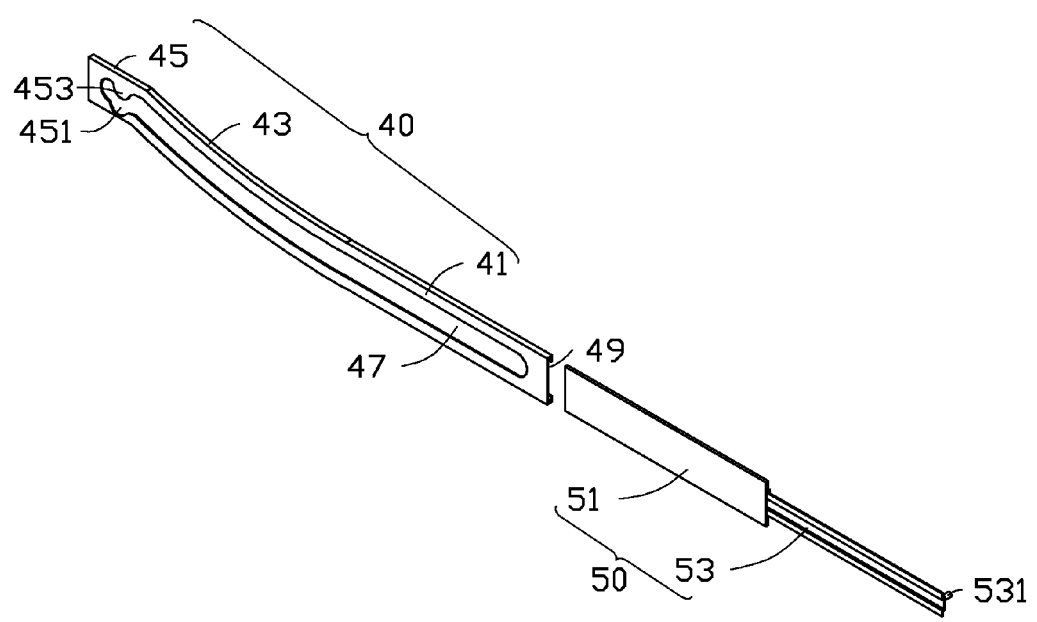
FIG. 5 is an exploded, isometric view of a second exemplary embodiment of a guiding rail and sliding module for a server cabinet.

Referring to FIG. 5, a second exemplary embodiment of a guiding rail 40 for a cabinet 100 is illustrated. A guiding slot 47 is defined in the guiding rail 40. In the second exemplary embodiment, the guiding rail 40 includes a connection portion 41, an inclined portion 43, and a positioning portion 45. The inclined portion 43 is arranged between the connection portion 41 and the positioning portion 45. An angle in a range of about 5°-85° is defined between the connection 41 and the inclined portion 43. The positioning portion 45 is substantially parallel to the connection 41. A positioning hole 451 is defined in one sidewall of the guiding slot 47 of the positioning portion 45, and a projection 453 protrudes from the other side wall of the guiding slot 47. A distance between the bottom surface of the positioning hole 451 and the projection 453 is substantially equal to a width of the guiding slot 47.

When the server 70 is locked to the frame 10 in the second exemplary embodiment, each wheel 73 is received in the corresponding positioning hole 451 so that a load of each latching element 75 is decreased.

It is understood that the server 70 can be locked to the frame 10 by means of fasteners, such as bolts or pins. Additionally, the sliding modules 50 can be omitted, and the server 70 attached to the guiding rails 30 or 40, and locked to the frame 10 by fasteners.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A server cabinet comprising:
a frame including a plurality of bottom plates, a plurality of side plates, the side plates being perpendicularly secured to the bottom plates;
a plurality of guiding rails secured to opposite sides of the side plates in pairs, each guiding rail comprising a connection portion and an inclined portion, an acute angle defined between the inclined portion and the connection portion, a receiving slot defined between opposite sides of each guiding rail; and
a plurality of sliding modules, each sliding module including a first sliding element and a second sliding element slidably attached to the first sliding element, each first sliding element being slidably received in the corresponding receiving slot;
wherein the acute angle is substantially about 5-85°, each guiding rail further comprises a positioning portion, the inclined portion is between the connection portion and the positioning portion, and the positioning portion is substantially parallel to the connection portion, a guiding slot is defined in each guiding rail, a positioning hole is defined in one sidewall of the guiding slot of the positioning portion, a projection protrudes from the other sidewall of the guiding slot of the positioning portion, a distance between bottom surface of the positioning hole and the projection is substantially equal to a width of the guiding slot.

2. The server cabinet as claimed of claim 1, wherein the acute angle is 5°, 15°, 30°, 45°, 60°, 75°, or 85°.

3. A server cabinet comprising:
a frame;
a plurality of guiding rails, each guiding rail comprising a connection portion and an inclined portion, an acute angle defined between the inclined portion and the connection portion; and
a plurality of servers, one end of each server supported by the inclined portion of a pair of guiding rails and the other end of the server secured to the frame, air heated by the servers moving towards the ends supported by the corresponding inclined portions;
wherein each server comprises a housing, two wheels, and two latching elements, each wheel is attached to an opposite side of the housing, the latching elements latch the corresponding server to the frame, each latching element comprises a base portion and two elastic arms, and the two elastic arms project from the base portion and are V-shaped.

4. The server cabinet as claimed of claim 3, wherein the acute angle is substantially about 5-85°.

5. The server cabinet as claimed of claim 3, wherein the cabinet further comprises a plurality of sliding modules, a receiving slot is defined between opposite sides of each guiding rail to receive the corresponding sliding module.

6. The server cabinet as claimed of claim 3, wherein a loop groove is defined in each wheel to receive opposite sidewalls of the guiding slot.

7. The server cabinet as claimed of claim 4, wherein the acute angle is 5°, 15°, 30°, 45°, 60°, 75°, or 85°.

8. The server cabinet as claimed of claim 4, wherein each guiding rail further comprises a positioning portion, the inclined portion is between the connection portion and the positioning portion, and the positioning portion is substantially parallel to the connection portion.

9. The server cabinet as claimed of claim 5, wherein each sliding module comprising a first sliding element and a second sliding element, the second sliding element is slidably attached to the first sliding element, and the first sliding element is slidably received in the receiving slot of the corresponding guiding rail.

10. The server cabinet as claimed of claim 8, wherein a guiding slot is defined in each guiding rail, a positioning hole is defined in one sidewall of the guiding slot of the positioning portion, a projection protrudes from the other sidewall of the guiding slot of the positioning portion, a distance between bottom surface of the positioning hole and the projection is substantially equal to a width of the guiding slot.

\* \* \* \* \*